United States Patent [19]
Fujioka

[11] Patent Number: 6,020,781
[45] Date of Patent: *Feb. 1, 2000

[54] STEP-UP CIRCUIT USING TWO FREQUENCIES

[75] Inventor: Shinya Fujioka, Kawasaki, Japan

[73] Assignee: Fujitsu Limited, Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/932,604

[22] Filed: Sep. 17, 1997

[30] Foreign Application Priority Data

Dec. 27, 1996 [JP] Japan ................................ 8-351275

[51] Int. Cl.[7] ................................ G05F 1/10; H03K 3/02
[52] U.S. Cl. ..................... 327/541; 327/536; 327/142; 327/198; 365/189.11; 331/46; 331/48; 331/57; 363/60
[58] Field of Search .................................. 327/534, 535, 327/536, 537, 538, 540, 541, 143, 198, 291, 293, 294, 276, 589; 331/46, 48, 49, 50, 57, 177 R; 365/189.09, 189.11, 226; 363/59, 60

[56] References Cited

U.S. PATENT DOCUMENTS

| | | |
|---|---|---|
| 5,075,572 | 12/1991 | Poteet et al. ............................ 327/537 |
| 5,159,543 | 10/1992 | Yamawaki ................................ 363/60 |
| 5,208,557 | 5/1993 | Kersh, III ................................ 331/57 |
| 5,416,446 | 5/1995 | Holler, Jr. et al. ..................... 327/114 |
| 5,418,499 | 5/1995 | Nakao ..................................... 331/57 |
| 5,594,391 | 1/1997 | Yoshizawa ............................ 327/264 |
| 5,633,825 | 5/1997 | Sakuta et al. ..................... 365/189.09 |
| 5,694,308 | 12/1997 | Cave ....................................... 363/59 |
| 5,801,987 | 9/1998 | Dinh ................................ 365/185.18 |

*Primary Examiner*—Timothy P. Callahan
*Assistant Examiner*—Terry L. Englund
*Attorney, Agent, or Firm*—Nikaido Marmelstein Murray & Oram, LLP

[57] ABSTRACT

A step-up circuit includes a selection control circuit 50 for activating a start/stop signal STP by detecting an external power-supply voltage Vcc, which is stable at 3.3 V, to reach 2.0 V or more, a ring oscillator circuit 30 for generating and outputting a clock of a high frequency Fs when the start/stop signal STP is inactive, a ring oscillator circuit 10 for generating a clock of a low frequency fo, a selection circuit 40 for selecting the output of the oscillator 30 when the start/stop signal STP is inactive and for selecting the output of the oscillator 10 when the start/stop signal is active, and a charging pump circuit 20 driven by the clocks. High frequency Fs is initially used to quickly bring an output voltage up to a desired operating level and low frequency fo is used, in order to conserve power, to maintain the operating level once a predetermined level of the external power supply voltage Vcc has been reached in order to conserve power.

10 Claims, 7 Drawing Sheets

RING OSCILLATOR

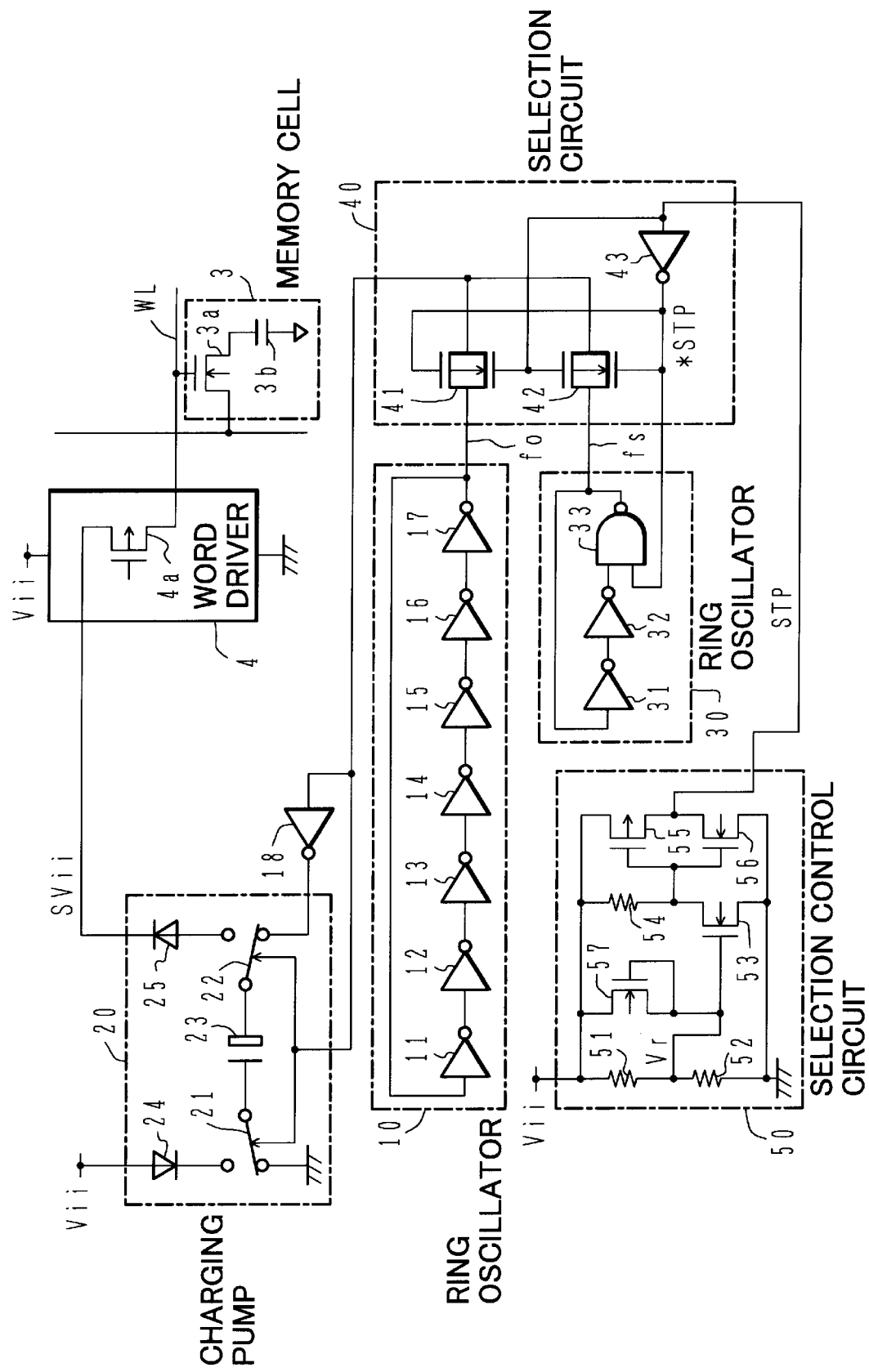

STEP-UP CIRCUIT USING TWO FREQUENCIES

BACKGROUND OF THE INVENTION

1. Field of the Invention

The present invention relates to a step-up circuit and a semiconductor device employing same.

2. Description of the Related Art

In a semiconductor integrated circuit, along with the minuteness of circuit elements and large-scale circuits, power-supply voltages are being lowered, and different power-supply voltages are being used to power multiple semiconductor devices mounted on printed circuit boards.

In the semiconductor device LSI1 of FIG. 6(A), for example, an internal circuit 1 as a mainframe circuit operates with a power-supply voltage of Vii=2.4 V. To standardize the power-supply voltage supplied to the various semiconductor devices, an external power-supply voltage of Vcc=3.0 V is stepped down to an internal voltage of Vii by an nMOS transistor 2. Gate potential Vgn is generated at a control circuit (not shown) and provided to the gate electrode of the nMOS transistor 2 to make the internal voltage Vii constant. By using a pMOS transistor, external power-supply voltage Vcc can be used in the control circuit. However, since gate potential Vgn is about 3.3 V, which is higher than external potential Vcc, an internal step-up circuit is required when using an nMOS transistor.

Here, when using an nMOS as the transistor 2, because it is possible to achieve higher-speed operation than when using a pMOS transistor, the internal power-supply voltage can be better stabilized.

When using a pMOS as the transistor 2, because of the relationship between the inductance component of the external pin connected to the source of the transistor and the feedback control circuit for the pMOS gate potential, overdrive occurs and a back electromotive force which cannot be ignored is generated at the inductance component, causing power supply noise. When using an nMOS transistor, the relationship with the gate potential control circuit is different from the described above, and no such a problem occurs. For these reasons, it is preferred to use an nMOS as the transistor 2.

FIG. 6(B) shows part of semiconductor memory storage LSI2 as an example for another occasion requiring an internal step-up circuit. For example, when the charge stored at a capacitor 3b is transferred to a bit line BL by turning on an nMOS transistor 3a, the potential change of the bit line BL is small since the capacity of the bit line BL exceeds that of capacitor 3b. Also, the resistance of Word line WL connected to the gate electrode of the nMOS transistor 3a is considerably high. Therefore, the potential drops that may occur when the electric charge flows through nMOS transistor 3a must be minimized. So, a potential SVii provided to the word line WL through a pMOS transistor 4a of a Word driver 4 is set high. For example, the potential SVii is 4.5 V when Vii=2.4 V, and an internal step-up circuit is needed.

FIG. 7 shows a prior art step-up circuit. In this circuit, a clock is generated by a ring oscillator 10 comprising inverters 11 to 17 connected in a ring shape. This clock is provided to a charging pump circuit 20 via a buffering inverter 18. The output of ring oscillator circuit 10 is also used for On/Off control of switch elements 21 and 22. If this output is at a low level and switch elements 21 and 22 are in the status shown in the figure, a pumping capacitor 23 is charged by an output potential Vcc of the inverter 18. Next, if the output of the ring oscillator circuit 10 transits to a low level, switches 21 and 22 are respectively switched to the cathode side of diode 24 and anode side of diode 25, and the voltage of the pumping capacitor 23 is added to the external power-supply voltage Vcc. Thereby, the cathode potential V00 of the diode 25 becomes 2(Vcc−Vpn), where Vpn is a forward voltage of each diodes 24 and 25. Although the output voltage V00 is lowered according to power consumption, by repeating this step-up operations the voltage V00 can be obtained.

The charging pump circuit 20 in FIG. 7 shows the principle configuration, and actually switch elements are used instead of diodes 24 and 25 in order to reduce the drop in voltage Vpn and the switch elements are turned off during the blocking time for back flow.

When such a step-up circuit is applied to, for example, a circuit generating the gate potential Vgn of the semiconductor device LSI1 shown in FIG. 6(A) and the power is supplied to the semiconductor device LSI1, the problems as described below are encountered. Namely, since the step-up circuit will not operate until the external power supply potential Vcc reaches a specified potential, and since voltages drop due to power consumption, it takes, e.g., 400 $\mu$ second for the power supply voltage V00 to reach the specified value +/−10%, which delays starting operation of the internal circuit 1.

To accelerate the startup time for voltage V00 by increasing the output frequency of the ring oscillator circuit 10 will cause a load driving capacity of the step-up circuit to become unnecessarily large after startup, a power waste arising.

SUMMARY OF THE INVENTION

Accordingly, an object of the present invention is to provide a step-up circuit and a semiconductor device employing same which can reduce the time for a step-up voltage to reach a target value after power-on and save power consumption in normal operation.

According to the 1st aspect of the present invention, there is provided a step-up circuit comprising: a selection control circuit for setting a control signal at one state in response to an external power-supply voltage being above a value which is lower than a normal voltage; a clock generating circuit for providing a first clock with a first frequency when the control signal not being at the one state and for providing a second clock with a second frequency when the control signal being at the one state, the second frequency being lower than the first frequency; and a charging pump circuit driven by the first and second clocks.

With the 1st aspect of the present invention, since the output clock frequency of the clock generation circuit becomes the first frequency higher than the second frequency at the initial stage after a power-on, the charging pump circuit is driven by this clock to step up the power-supply voltage at a high-speed, thus reducing the time needed for the step-up voltage to reach the target value after power-on.

Also, after a mini power failure, the step-up circuit is operated the same way as described above, reducing a failure-recovery time.

Moreover, after the internal power-supply voltage reaches the target value, the output clock frequency of the clock generation circuit is the second frequency lower than the first frequency, and the charging pump circuit is driven by this clock for step-up operation, thus effectively saving power consumption in normal operation.

In the 1st mode of the 1st aspect of the present invention, the clock generating circuit comprises: a first ring oscillator circuit for generating the first clock when the control signal is not at the one state; a second ring oscillator circuit for generating the second clock; and a selection circuit for selectively providing the first clock to the charging pump when the control signal is not at the one state and for selectively providing the second clock to the charging pump when the control signal is at the one state.

In the 2nd mode of the 1st aspect of the present invention, the clock generating circuit comprises: a ring oscillator including an odd number of CMOS inverters connected in ring shape, each of the CMOS inverters has a pMOS transistor and a nMOS transistor connected in serial to each other, a first pMOS transistor connected between the pMOS transistor of the CMOS inverter and a power-supply potential conductor, its gate electrode receiving a potential to normally turn on the first pMOS transistor; a second pMOS transistor connected between the pMOS transistor of the CMOS inverter and the power-supply potential conductor, its gate electrode receiving a signal associated with the control signal to turn on the second pMOS transistor when the control signal is not at the one state; a first nMOS transistor connected between the nMOS transistor of the CMOS inverter and a reference potential conductor, its gate electrode receiving a potential to normally turn on the first nMOS transistor; and a second nMOS transistor connected between the nMOS transistor of the CMOS inverter and the reference potential conductor, its gate electrode receiving a signal associated with the control signal to turn on the second pMOS transistor when the control signal is not at the one state.

In the 3rd mode of the 1st aspect of the present invention, the second pMOS transistor have a value of (gate width)/(gate length) which is larger than that of the first pMOS transistor, and the second nMOS transistor have a value of (gate width)/(gate length) which is larger than that of the first nMOS transistor.

With the 3rd mode of the 1st aspect of the present invention, since the first frequency at the initial stage after a power-on becomes more higher, it takes less time for a step-up voltage to reach the target value.

In the 4th mode of the 1st aspect of the present invention, the clock generating circuit comprises: a first multi-stage inverter circuit including an odd number, which is 5 or more, of inverters connected in cascade; a second multi-stage inverter circuit including an even number of inverters connected in cascade; a first switch element connected between an output of a last stage inverter of the first multi-stage inverter circuit and an input of a first stage inverter of the second multi-stage inverter circuit; a second switch element connected between an output of a last stage inverter of the second multi-stage inverter circuit and an input of a first stage inverter of the first multi-stage inverter circuit; and a third switch element connected between the output of the last stage inverter of the first multi-stage inverter circuit and the input of the first stage inverter of the first multi-stage inverter circuit; the first, second and third switch elements being turned on, on and off respectively when the control signal is at the one state, and the first, second and third switch elements being turned off, off and on respectively when the control signal is not at the one state.

With the 4th mode of the 1st aspect of the present invention, it is possible to reduce the number of configuration elements of the clock generation circuit more than that of the first mode.

In the 5th mode of the 1st aspect of the present invention, the charging pump circuit comprises a capacitor which voltage is added to a voltage between the power-supply potential and the reference potential and which capacitance is switched by the control signal in such a way that a value of the capacitance in the case of the control signal not being at the one state is larger than that in the case of the control signal being at the one status.

With the 5th mode of the 1st aspect of the present invention, since the first frequency at the initial stage after a power-on becomes more higher, it takes less time for a step-up voltage to reach the target value.

According to the 2nd aspect of the present invention, there is provided a semiconductor device comprising a step-up circuit formed on a semiconductor chip, wherein the step-up circuit comprises: a selection control circuit for setting a control signal at one state in response to an external power-supply voltage being above a value which is lower than a normal voltage; a clock generating circuit for providing a first clock with a first frequency when the control signal is not at the one state and for providing a second clock with a second frequency when the control signal is at the one state, the second frequency being lower than the first frequency; and a charging pump circuit driven by the first and second clocks.

In the 1st mode of the 2nd aspect of the present invention, the charging pump circuit operates under the external power-supply voltage, wherein the semiconductor device further comprises: a circuit operated under an internal power-supply voltage lower than the external power-supply voltage; a wiring, an nMOS step-down transistor, its drain receiving the external power-supply voltage, its source supplying the internal power-supply voltage; and a control circuit, operated under an output voltage of the charging pump circuit, for providing a constant voltage to a gate electrode of the nMOS step-down transistor.

In the 2nd mode of the 2nd aspect of the present invention, the charging pump circuit operates under an internal power-supply voltage lower than the external power-supply voltage, wherein the semiconductor device further comprises: a memory cell including a nMOS transistor with its gate electrode connected to a word line; and a word driver transistor through which an output voltage of the charging pump is provided to the word line.

BRIEF DESCRIPTION OF THE DRAWINGS

FIG. 5 is a circuit diagram showing a semiconductor device, to which a step-up circuit of the present invention applied, of a fourth embodiment according to the present invention;

DESCRIPTION OF THE PREFERRED EMBODIMENTS

Figure 1:
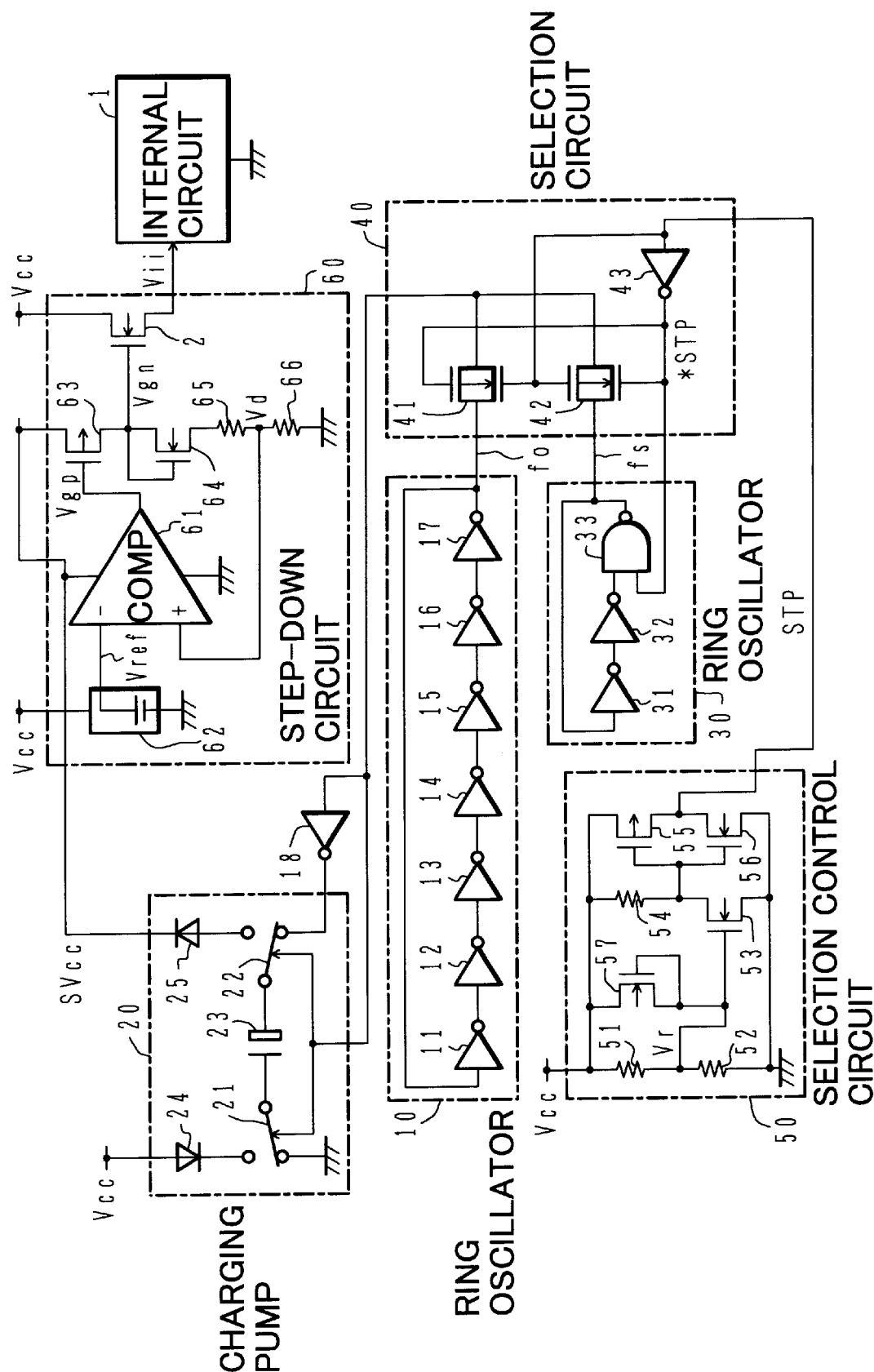
FIG. 1 is a circuit diagram showing a semiconductor device, to which a step-up circuit of the present invention is applied, of a first embodiment according to the present invention.

Referring now to the drawings, wherein like reference characters designate like or corresponding parts throughout several views, preferred embodiments of the present invention are described below.

First Embodiment

Figure 6A:
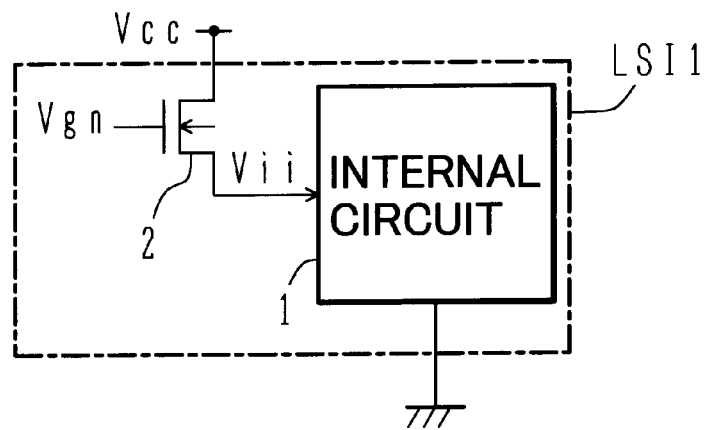
FIGS. 6(A) and 6(B) are diagrams each showing a prior art circuit necessary for a step-up circuit.
Figure 6B:
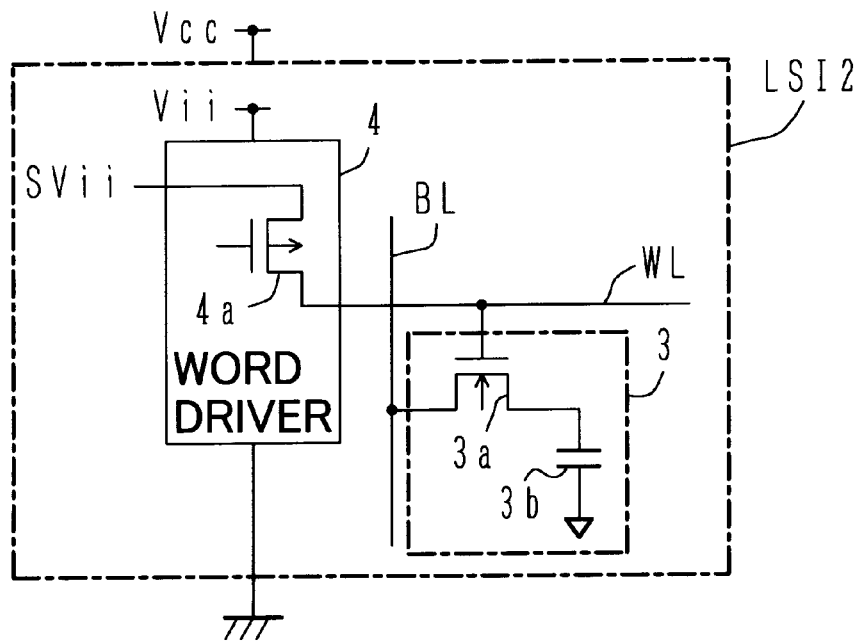

FIG. 1 shows a semiconductor device, to which a step-up circuit of the present invention is applied, of the first embodiment. In FIG. 1, the same configuration elements as in FIGS. 6(A) and FIG. 7 are designated by the same reference characters and these explanation are omitted.

Figure 7:
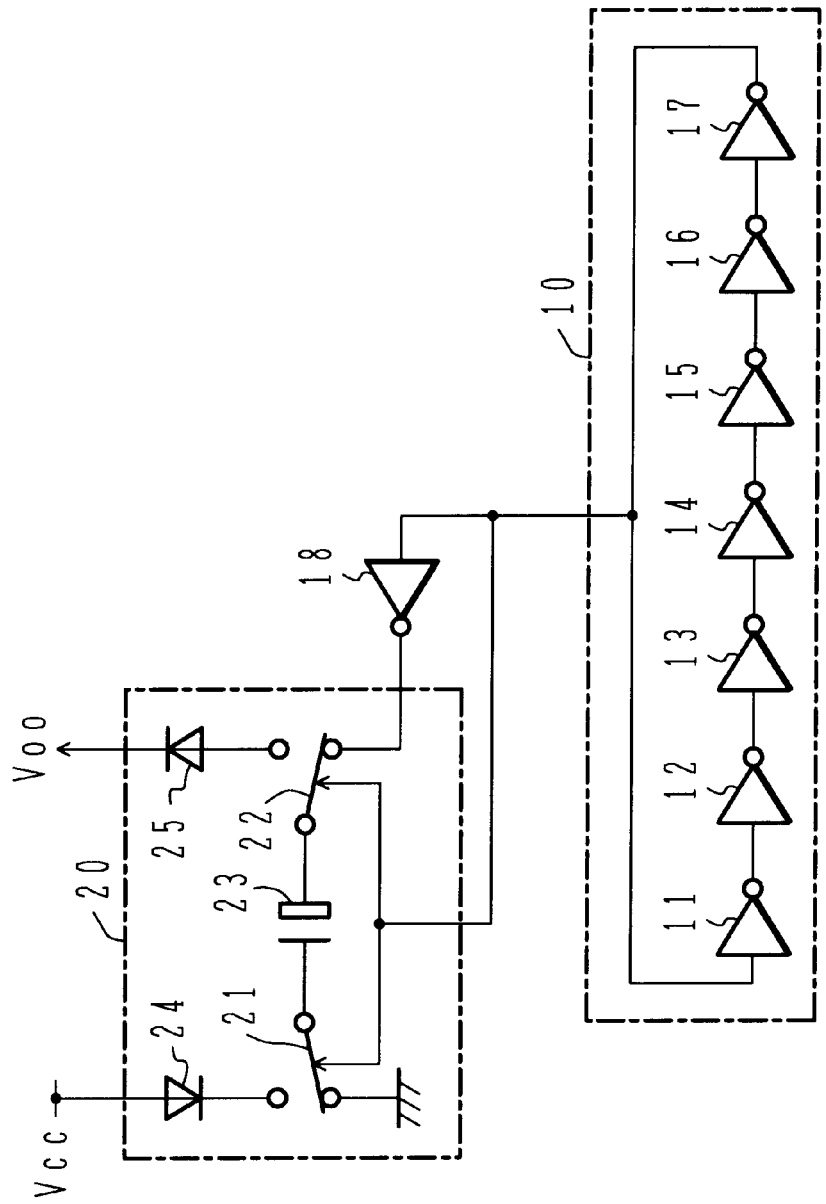
FIG. 7 is a diagram showing a prior art step-up circuit.

In this step-up circuit, a ring oscillator circuit 30, a selection circuit 40 and a selection control circuit 50 are added to a ring oscillator circuit 10, an inverter 18 and a charging pump circuit 20 of FIG. 7. The charging pump circuit 20 is shown as the principle configuration for simplification as described above.

The ring oscillator circuit 30 consists of an inverter 31, an inverter 32 and a NAND gate 33 which are connected in a ring shape.

If one input, as a control input, of the NAND gate 33 becomes a low, the ring oscillator circuit 30 does not oscillate. If this low level transits to a high, the NAND gate will function as an inverter and the ring oscillator circuit 30 will then oscillate, and a clock of a frequency Fs is output as pumping pulses. On the other hand, a clock of a frequency which is lower than frequency Fs is always output as pumping pulses from the ring oscillator circuit 10.

Selection circuit 40 is provided with transfer gates 41 and 42 and inverter 43. Input ends of transfer gates 41 and 42 are connected to the outputs of the ring oscillator circuits 10 and 30, respectively, and output ends thereof are connected to the input of the inverter 18 and to the control inputs of switch elements 21 and 22. Each of the transfer gates 41 and 42 is constructed by connecting a pMOS transistor and an nMOS transistor in parallel. A start/stop signal STP is provided to the gate electrodes of the nMOS transistor of the transfer gate 41 and of the pMOS transistor of the transfer gate 42. A signal *STP, generated by inverting the binary value of the start/stop signal STP at inverter 43, is provided to the gate electrodes of the pMOS transistor of the transfer gate 41 and of the nMOS transistor of the transfer gate 42. The start/stop signal *STP is also provided to the input, as the control input, of the NAND gate 33.

When the start/stop signal STP is at a low level, the transfer gates 41 and 42 are off and on respectively and the output clock of the ring oscillator circuit 30 is output from the selection circuit 40. Whereas, when the start/stop signal STP is at a high level, the transfer gates 41 and 42 are on and off respectively and the output clock of the ring oscillator 10 is output from the selection circuit 40.

A power-supply voltage for the ring oscillator circuits 10 and 30 and the selection circuit 40 is an external power-supply voltage Vcc.

In the selection control circuit 50, resistors 51 and 52 are serially connected between a Vcc wiring supplied with an external power-supply potential Vcc and a grounding wiring, and a divided potential Vr at its connection is provided to the gate electrode of an nMOS transistor 53. The source of the nMOS transistor 53 is connected to the grounding wiring, with its drain connected via a resistor 54 to the Vcc wiring. The drain potential of the nMOS transistor 53 is provided to the gate electrodes of a pMOS transistor 55 and an nMOS transistor 56. The pMOS transistor 55 and the nMOS transistor 56 are serially connected between the Vcc wiring and the grounding wiring, and consists of a CMOS inverter. The start/stop signal STP is output from the output of this inverter.

When the external power-supply potential Vcc has risen to, e.g., 0.4 V from 0 V after power-on, the nMOS transistor 56 turns on, and further when the potential Vcc has risen to 2 V, the divided potential Vr reaches 0.4 V and the nMOS transistor 53 turns on. Thereby, the pMOS transistor 55 turns on, the nMOS transistor 56 turns off, and the start/stop signals STP and *STP respectively become high and low.

An nMOS transistor 57 connected between the gate electrode of the nMOS transistor 53 and the Vcc wiring is normally off, but turns on when the external power-supply potential Vcc has dropped near to 0 V by a mini power failure. Thereby the charge at the gate of the nMOS transistor 53 is discharged quickly through the nMOS transistor 57 and when the potential Vcc subsequently rises, the described above operation is ensured.

In a step-down circuit 60, the relationship Vii=Vgn−Vth holds, where Vgn and Vth are a gate potential and a threshold voltage of the nMOS transistor 2, respectively. To generate the internal power-supply potential of Vii=2.4 V even when the external power-supply potential Vcc is such a low as 2.4 or so, SVcc of, for example, 4.0 V is supplied to a comparator 61.

At the inverting input of the comparator 61, a reference potential Vref from a reference potential generator circuit 62 is provided, and a gate potential Vgp is output from the comparator 61. Between a wiring of the power-supply potential SVcc and the grounding wiring, a pMOS transistor 63, an nMOS transistor 64, a resistor 65, and a resistor 66 are serially connected. At the gate electrode of a pMOS transistor 63, the gate potential Vgp is provided. The source potential Vgn of the pMOS transistor 63 is provided to the gate electrode of the nMOS transistor 2. The drain of the nMOS transistor 2 is connected to the Vcc wiring, and the external potential Vcc is lowered, for instance, to 2.4 V for supplying to an internal circuit 1.

The drain and the gate electrodes of the nMOS transistor 64 are short-circuited in order to prevent the internal power-supply potential Vii from changing according to ambient temperature. A potential Vd at the connection point of the resistors 65 and 66 is provided to the non-inverting input of the comparator 61.

The comparator 61 outputs the gate potential Vgp so that the potential Vd becomes equal to the reference potential Vref. In other words, if Vd<Vref, then the gate potential Vgp drops and the current flowing through pMOS transistor 63 increases, raising the potential Vd. Whereas, if Vd>Vref, then the gate potential Vgp is raised, and the current flowing through pMOS transistor 63 decreases, lowering the potential Vd.

Figure 2:
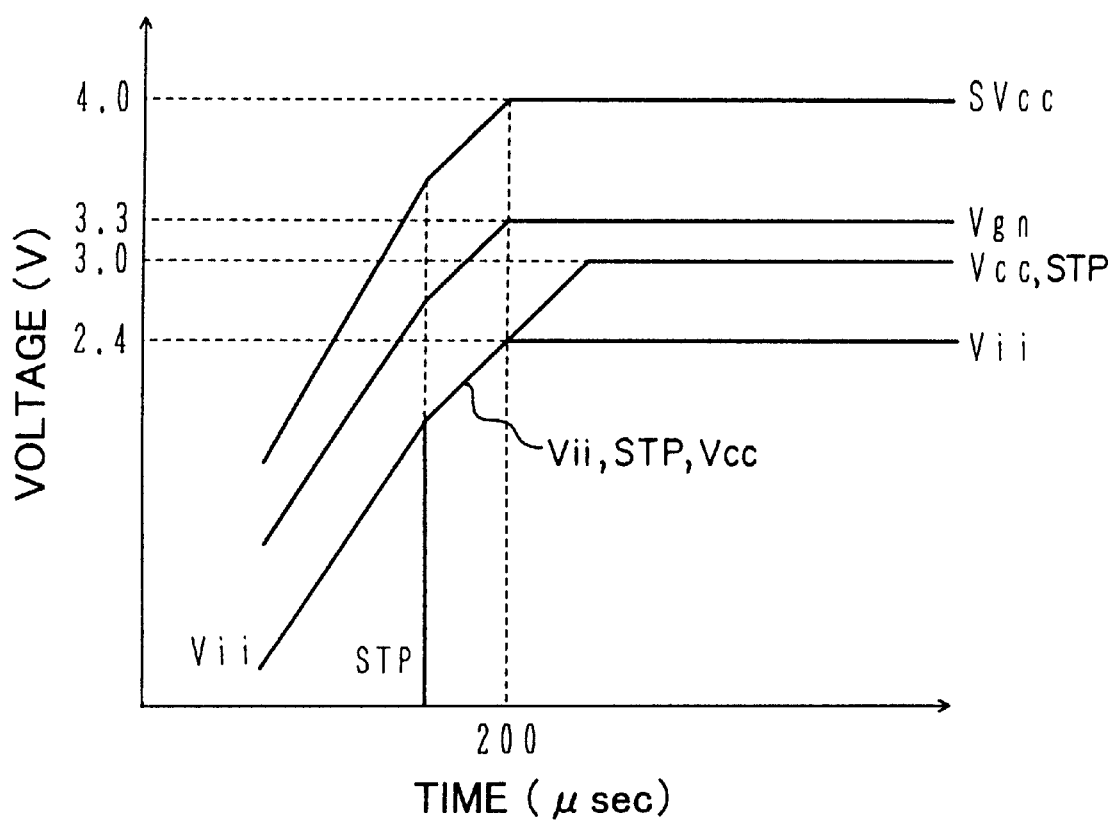
FIG. 2 is a diagram showing an operation of the circuit of FIG. 1.

Referring to FIG. 2, followings are explanations of the operation of the semiconductor device configured as described above.

When the power is turned on, Vcc increases linearly from 0 V to 3.0 V. At a midpoint in this increase, when Vcc reaches about 1.0 V, the step-up circuit starts to operate. At this time, the start/stop signal STP is a low, the transfer gate 41 is off, and the transfer gate 42 is on. The output clock of the ring oscillator circuit 30 is provided via the transfer gate 42 and the inverter 18 to the charging pump circuit 20. In this way, more high-speed step-up operation can be performed than the case of driving the charging pump circuit 20 by using the output clock of the ring oscillator circuit 10.

After that midpoint, when Vcc reaches about 2.0 V, Vr becomes about 0.4 V, and the nMOS transistor 53 is turned on, the pMOS transistor 55 is turned on and the nMOS transistor 56 is turned off, thereby the start/stop signal STP becomes a high. Then, the transfer gates 41 and 42 turn on and off respectively, and the output clock of ring oscillator circuit 10 is provided via transfer gate 41 and inverter 18 to the charging pump circuit 20, thereby appropriately lowering the step-up operation speed of the charging pump circuit 20.

After this, when SVcc reaches about 4.0 V, Vgn becomes about 3.3 V and Vii becomes about 2.4 V. Although, Vcc is raised up to 3.0 V after this, SVcc, Vgn and Vii are almost constant.

According to the first embodiment, because the charging pump circuit 20 is driven by the higher frequency output of the ring oscillator circuit 30 at the initial stage after a power-on, the Potential SVcc is stepped up at high-speed, allowing to take 200 μsecond for the internal power-supply potential Vii to reach the target value +/−10%, compared to the conventional 400 μsecond, and reducing the startup time of the internal circuit 1 after a power-on.

After a mini power failure, the step-up circuit is operated the same way as described above, allowing to reduce a failure-recovery time.

After the internal power-supply potential Vii has reached the target value, the ring oscillator circuit 30 stops its operation, and the charging pump circuit 20 is driven by the output of the ring oscillator circuit 10 for step-up operation, allowing to save power consumption in ordinary operation.

Second Embodiment

Figure 3:
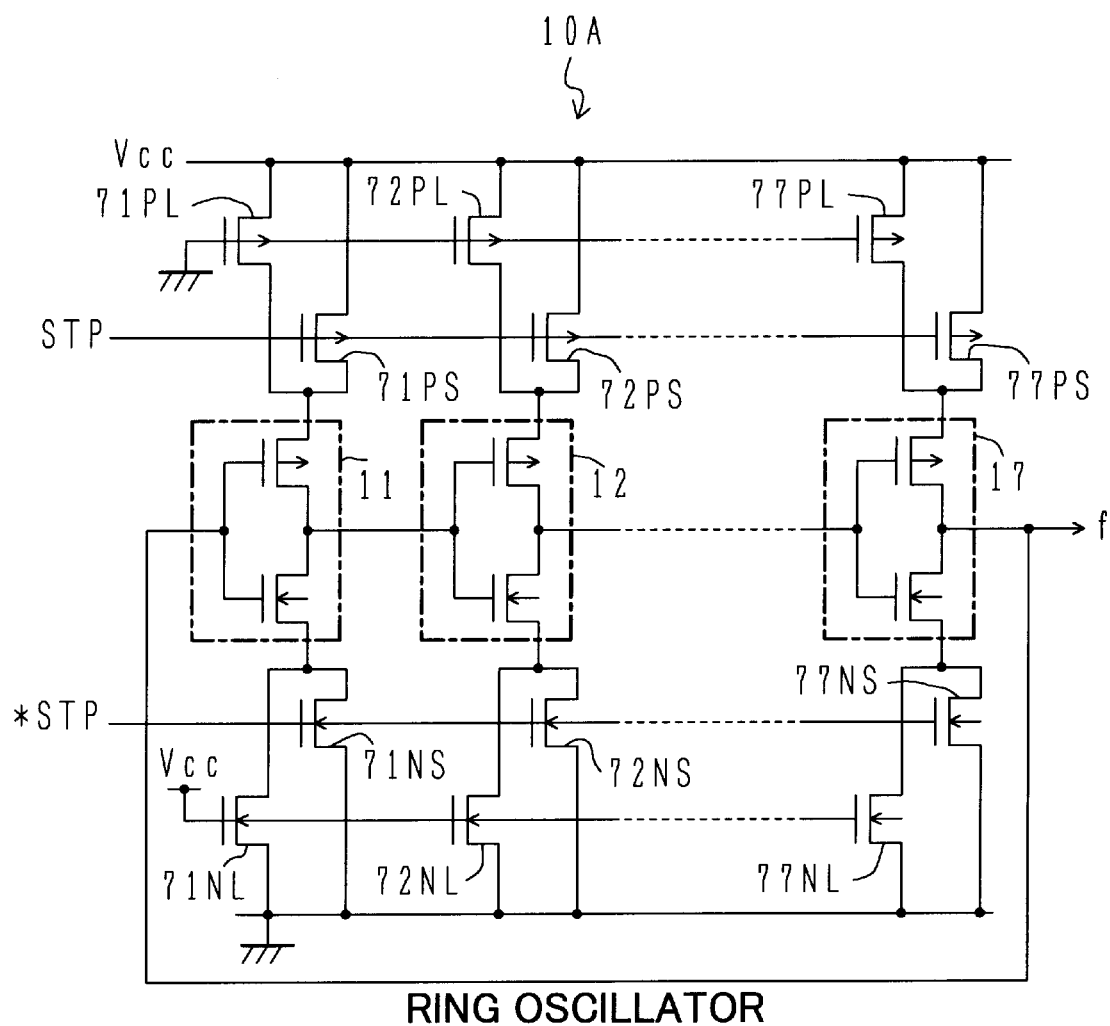
FIG. 3 is a diagram showing a ring oscillator circuit of a second embodiment used for a step-up circuit of the present invention.

FIG. 3 shows a ring oscillator circuit 10A of the second embodiment that is employed instead of the ring oscillator circuits 10, 30 and the selection circuit 40 in FIG. 1.

This circuit is the same as the ring oscillator circuit 10 in the point where inverters 11 to 17 are connected in ring shape. pMOS transistors 71PL and 71PS are connected in parallel between one end of the inverter 11 and the Vcc wiring. The gate widths of the pMOS transistors 71PL and 71PS are the same but the gate length of the pMOS transistor 71PL is longer than the pMOS transistor 71PS. nMOS transistors 71NL and 71NS are connected in parallel between the other end of the inverter 11 and the grounding wiring. The gate widths of the nMOS transistors 71NL and 71NS are the same, but the gate length of the nMOS transistor 71NL is longer than the nMOS transistor 71NS. The connections for one and the other end of the inverters 12 to 17 are like those of the inverter 11.

The gate electrodes of pMOS transistors 71PL to 77PL are connected to the grounding wiring, and these transistors are normally on. The gate electrodes of nMOS transistors 71NL to 77NL are connected to the Vcc wiring, and these transistors are normally on. The start/stop signal STP is provided to the gate electrodes of the pMOS transistors 71PS to 77PS, and the start/stop signal *STP is provided to the gate electrodes of the nMOS transistor 71NS to 77NS.

The operation of the ring oscillator circuit 10A configured as described above is as follows.

After power-on, when Vcc reaches about 1.0 V, this circuit starts to operate. At this time, the start/stop signals STP and *STP are at a low and a high respectively, and the pMOS transistors 71PS to 77PS and nMOS transistors 71NS to 77NS are on. Since a current supply capacity from the Vcc wiring to the inverters 11 to 17, and a current exhausting capacity from the inverters 11 to 17 to the grounding wiring are larger than the case where the pMOS transistors 71PS to 77PS and the nMOS transistors 71NS to 77NS are off, an output frequency f of the ring oscillator circuit 10A becomes higher. Thereby, the charging pump circuit 20 in FIG. 1 driven by the ring oscillator circuit 10A achieves a higher operation speed than normal operation.

After this, when Vcc reaches around 2 V, the start/stop signals STP and *STP become a high and a low respectively, then the pMOS transistors 71PS to 77PS and the nMOS transistors 71NS to 77NS are turned off, thereby appropriately lowering the output frequency f of the ring oscillator circuit 10A and saving power consumption in normal operation.

Third embodiment

Figure 4:
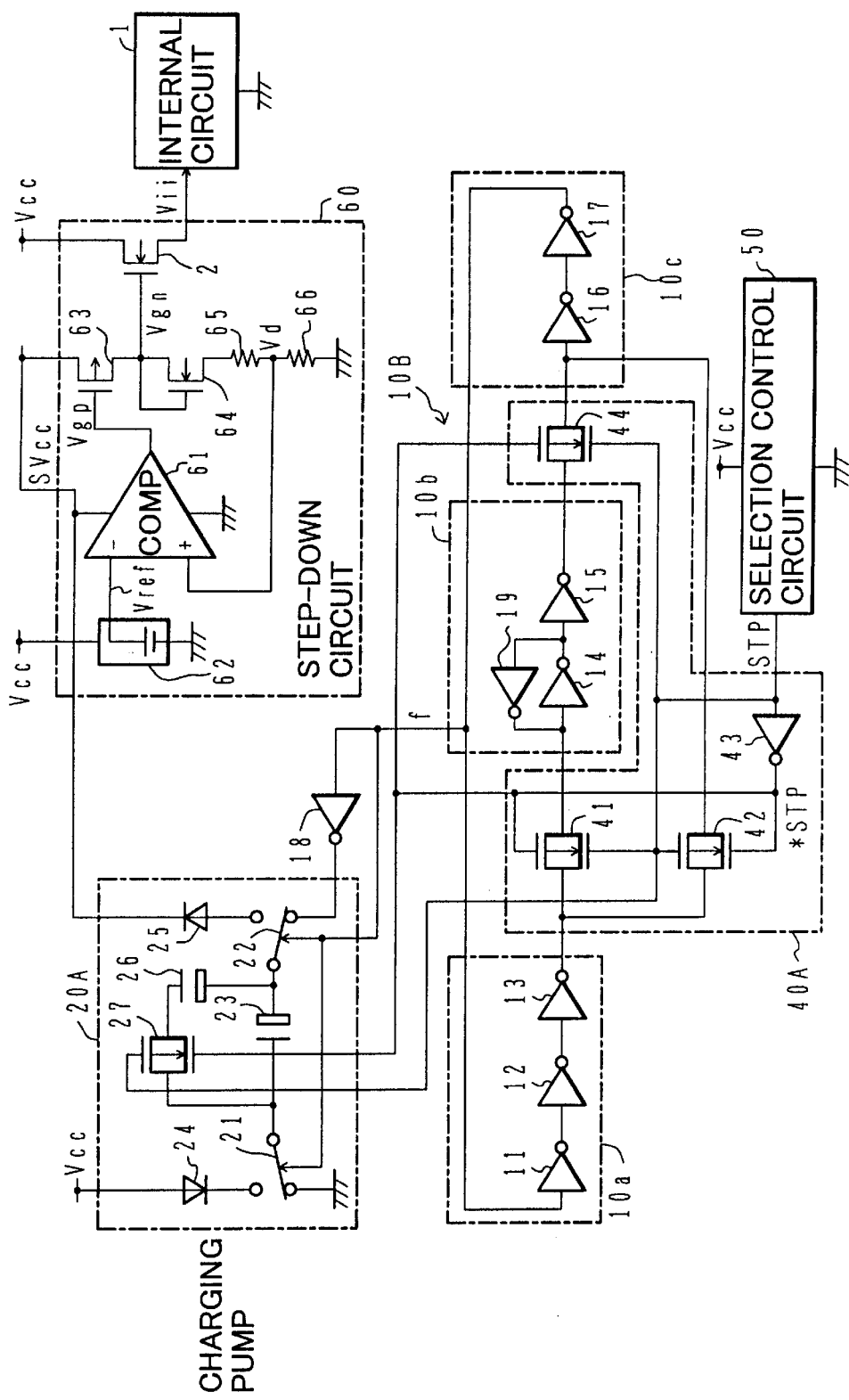
FIG. 4 is a circuit diagram showing a semiconductor device, to which a step-up circuit of the present invention is applied, of a third embodiment according to the present invention.

FIG. 4 shows a semiconductor device of the third embodiment to which a step-up circuit of the present invention is applied.

In this step-up circuit, a ring oscillator circuit 10B consists of a first part 10a, a second part 10b, a third part 10c and a selection circuit 40A. The first part 10a consists of inverters 11 to 13 connected in cascade. The second part 10b consists of the inverters 14 and 15 connected in cascade and an inverter 19, which is smaller than the inverter 14, connected to the inverter 14 in ring shape. The third part 10c consists of inverters 16 and 17 connected in cascade. The output of the inverter 17 is connected to the input of the inverter 11.

In the selecting circuit 40A, a transfer gate 41 is connected between the output of the inverter 13 and the input of the inverter 14, a transfer gate 42 is connected between the output of the inverter 13 and the input of the inverter 16 and a transfer gate 44 is connected between the output of the inverter 15 and the input of the inverter 16. An on/off control of the transfer gates 41 and 42 is performed by the start/stop signals STP and *STP in the like manner as the case of FIG. 1. An on/off control of the transfer gate 44 is linked with that of the transfer gate 41.

The inverter 19 prevents a current flow from leaking from the power supply wiring through the inverter 14 to the grounding wiring when the input of the inverter 14 enters in a floating status near a potential Vcc/2.

In a charging pump circuit 20A, a pumping capacitance can be switched according to the start/stop signals. In other words, the positive electrode of the pumping capacitor 23 is connected to the positive electrode of a pumping capacitor 26, and the negative electrode of the pumping capacitor 26 is connected via a transfer gate 27 to the negative electrode of the pumping capacitor 23. The start/stop signals *STP and STP are respectively provided to the nMOS and pMOS transistors of the transfer gate 27.

Other configurations are the same as those of the first embodiment.

When the start/stop signal STP is at a low, the transfer gates 41 and 44 are off, the transfer gate 42 is on, and a bypass from the output of the inverter 13 via the transfer gate 42 to the input of the inverter 16 is formed, thereby configuring a ring oscillator with 5-stage inverters and allowing to arise a frequency f higher than that of normal operation. Therefor, like effects as in the above first embodiment can be obtained. Also, since the transfer gate 27 is on, the pumping capacitors 23 and 26 are connected in parallel, and the charge amount at the pumping capacitors at every pumping pulse is larger than that of normal operation, thereby increasing a current supply capacity of the charging pump circuit 20A. Thus, the above-described effects improve.

After the above operation, when the start/stop signal STP becomes at a high, the transfer gates 41 and 44 are turned on and the transfer gate 42 is turned off, thereby the 7-stage ring oscillator circuit 10B is configured with the first part 10a, the second part 10b, and the third part 10c, allowing to operate as the same way as the ring oscillator 10 of FIG. 1. Also, the transfer gate 27 is turned off, allowing the charging pump circuit 20A to operate as the same way as the charging pump circuit 20 of FIG. 1.

Fourth Embodiment

FIG. 5 shows a semiconductor device of the fourth embodiment to which a step-up circuit of the present invention is applied.

This device is a semiconductor memory to which the step-up circuit of FIG. 1 is applied, and the power-supply potential SVii output from the charging pump circuit 20 is applied to a word line WL via a pMOS transistor 4a of a word driver 4. For simplification, in FIG. 5, only one memory cell 3 is illustrated.

The charging pump circuit 20 and the selection control circuit 50 are part of the internal circuit 1 of FIG. 1 and the internal power-supply potential Vii is applied to the anode of the diode 24 and the power supply wiring in the selection control circuit 50. For example, when Vcc=3.0 V, Vii=2.4 V, the internal power-supply potential SVii is 4.5 V.

According to this semiconductor device, since the time that SVii reaches the target values +/−10% is reduced, the time until a memory access can be started is also reduced compared to prior art.

Although preferred embodiments of the present invention has been described, it is to be understood that the invention is not limited thereto and that various changes and modifications may be made without departing from the spirit and scope of the invention.

For example, although larger (gate width)/(gate length) is preferred for pMOS transistors 71PS to 77PS than pMOS transistors 71PL to 77PL, the present invention may be acceptable without meeting this condition.

The number of the inverters connected in cascade in each ring oscillator of FIGS. 1, 3 and 5 may be any odd number which is 3 or more, and that of ring oscillator 10B in FIG. 4 may be any odd number which is 5 or more.

Charge pump circuit applied to step-up circuit is not limited to the configuration shown in FIG. 1 or 4, and various types of it are applicable.

What is claimed is:

1. A step-up circuit comprising:
    a selection control circuit, receiving an external power supply voltage, for setting a control signal at a first state in response to the external power-supply voltage being lower than a predetermined voltage which is lower than the external power-supply voltage at a stable state;
    a clock generating circuit for providing a first clock with a first frequency when said control signal is at said first state and for providing a second clock with a second frequency when said control signal is at a second state, said second frequency being lower than said first frequency; and
    a charging pump circuit driven by a selected one of said first and second clocks.

2. A step-up circuit according to claim 1 wherein said clock generating circuit comprises:
    a first ring oscillator circuit for generating said first clock when said control signal is at said first state;
    a second ring oscillator circuit for generating said second clock; and
    a selection circuit for selectively providing said first clock to said charging pump circuit when said control signal is at said first state and for selectively providing said second clock to said charging pump circuit when said control signal is at said first state.

3. A step-up circuit according to claim 1 wherein said clock generating circuit comprises a ring oscillator including an odd number of CMOS inverter stages connected in ring shape, each of said CMOS inverter stages includes:
    a CMOS inverter with a pMOS transistor and an nMOS transistor connected in series to each other;
    a first pMOS transistor connected between said pMOS transistor of said CMOS inverter and a power-supply potential conductor, its gate electrode receiving a potential to normally turn on said first pMOS transistor;
    a second pMOS transistor connected between said pMOS transistor of said CMOS inverter and said power-supply potential conductor, its gate electrode receiving said control signal to turn on said second pMOS transistor when said control signal is at said first state;
    a first nMOS transistor connected between said nMOS transistor of said CMOS inverter and a reference potential conductor, its gate electrode receiving a potential to normally turn on said first nMOS transistor; and
    a second nMOS transistor connected between said nMOS transistor of said CMOS inverter and said reference potential conductor, its gate electrode receiving a signal associated with said control signal to turn on said second nMOS transistor when said control signal is at said first state.

4. A step-up circuit according to claim 3,
    wherein said second pMOS transistor has a value of (gate width)/(gate length) which is larger than that of said first pMOS transistor; and
    wherein said second nMOS transistor has a value of (gate width)/(gate length) which is larger than that of said first nMOS transistor.

5. A step-up circuit according to claim 1 wherein said clock generating circuit comprises:
    a first multi-stage inverter circuit including an odd number, which is 5 or more, of inverters connected in cascade;
    a second multi-stage inverter circuit including an even number of inverters connected in cascade;
    a first switch element connected between an output of a last stage inverter of said first multi-stage inverter circuit and an input of a first stage inverter of said second multi-stage inverter circuit;
    a second switch element connected between an output of a last stage inverter of said second multi-stage inverter circuit and an input of a first stage inverter of said first multi-stage inverter circuit; and
    a third switch element connected between said output of said last stage inverter of said first multi-stage inverter circuit and said input of said first stage inverter of said first multi-stage inverter circuit;
    said first, second and third switch elements being turned on, on and off respectively when said control signal is at said first state, and said first, second and third switch elements being turned off, off and on respectively when said control signal is at said second state.

6. A step-up circuit according to claim 1 wherein said charging pump circuit comprises a capacitor which voltage is added to said external power-supply voltage and which capacitance is switched by said control signal in such a way that a value of said capacitance when said control signal is at said first state is larger than that when said control signal is at said second state.

7. A semiconductor device comprising a step-up circuit formed on a semiconductor chip, wherein said step-up circuit comprises:

a selection control circuit, receiving an external power supply voltage, for setting a control signal at a first state in response to the external power-supply voltage being lower than a predetermined voltage which is lower than the external power-supply voltage at a stable state;

a clock generating circuit for providing a first clock with a first frequency when said control signal is at said first state and for providing a second clock with a second frequency when said control signal is at a second state, said second frequency being lower than said first frequency; and a charging pump circuit driven by a selected one of said first and second clocks.

8. A semiconductor device according to claim 7, wherein said charging pump circuit is connected with a power supply line having said external power-supply voltage, wherein said semiconductor device further comprises:

a circuit connected with a power supply line having an internal power-supply voltage lower than said external power-supply voltage;

an nMOS step-down transistor, its drain receiving said external power-supply voltage, its source supplying said internal power-supply voltage; and a control circuit, connected with a power supply line having an output voltage of said charging pump circuit, for providing a constant voltage to a gate electrode of said nMOS step-down transistor.

9. A semiconductor device according to claim 7, wherein said charging pump circuit receives an internal power-supply voltage lower than said external power-supply voltage, wherein said semiconductor device further comprises:

a memory cell including a nMOS transistor with its gate electrode connected to a word line; and a word driver transistor through which an output voltage of said charging pump circuit is provided to said word line.

10. A boost circuit, in a semiconductor integrated circuit receiving a first power supply voltage and a second power supply voltage, which is lower than the first power supply voltage, to operate, comprising:

a detection circuit connected with a first power supply line having the first power-supply voltage, for detecting when the first power supply voltage is higher than a reference voltage level which is between the first power supply voltage and the second power supply voltage, and for outputting a detection signal;

a clock generating circuit for outputting a clock signal with a frequency, the frequency changing to be lower in response to the detection signal indicating that the first power-supply voltage is higher than the reference voltage; and a charge pump circuit connected with the first power supply line for outputting a boost voltage in response to the clock signal.

* * * * *